(12) United States Patent
Inukai et al.

(10) Patent No.: US 7,443,703 B2
(45) Date of Patent: Oct. 28, 2008

(54) SEMICONDUCTOR DEVICE

(75) Inventors: Takashi Inukai, Kawasaki (JP);
Yukihiro Urakawa, Kawasaki (JP)

(73) Assignee: Kabushiki Kaisha Toshiba, Minato-Ku, Tokyo (JP)

(*) Notice: Subject to any disclaimer, the term of this patent is extended or adjusted under 35 U.S.C. 154(b) by 228 days.

(21) Appl. No.: 11/261,925

(22) Filed: Oct. 31, 2005

(65) Prior Publication Data
US 2006/0139973 A1    Jun. 29, 2006

(30) Foreign Application Priority Data
Dec. 28, 2004    (JP)    ............................ 2004-380793

(51) Int. Cl.
*H02H 7/10* (2006.01)
*H03K 5/08* (2006.01)
(52) U.S. Cl. ........................................ 363/50; 327/314
(58) Field of Classification Search ................... 363/50; 361/18, 54, 56, 88, 91.1, 91.5, 93.8, 111; 327/309, 310, 313, 314, 321, 322, 324–327
See application file for complete search history.

(56) References Cited

U.S. PATENT DOCUMENTS

| | | | | |
|---|---|---|---|---|
| 5,946,176 A | * | 8/1999 | Ghoshal | ........................ 361/56 |
| 6,388,850 B1 | * | 5/2002 | Ker et al. | ....................... 361/56 |
| 6,400,204 B1 | * | 6/2002 | Davis | ........................ 327/314 |
| 6,566,911 B1 | * | 5/2003 | Moyer | ........................ 326/83 |
| 6,649,944 B2 | * | 11/2003 | Ker et al. | ....................... 257/199 |
| 6,781,805 B1 | * | 8/2004 | Urakawa | ....................... 361/56 |
| 7,187,527 B2 | * | 3/2007 | Su et al. | ....................... 361/56 |

FOREIGN PATENT DOCUMENTS

| | | |
|---|---|---|
| JP | 2002-124573 | 4/2002 |
| WO | 2004/093133 | 10/2004 |

OTHER PUBLICATIONS

Chinese Office Action dated Jan. 18, 2008 for Application No. 200510138101.6 and English translation thereof.
Taiwanese Office Action dated Oct. 26, 2007 for Application 09520889790.

* cited by examiner

*Primary Examiner*—Matthew V Nguyen
(74) *Attorney, Agent, or Firm*—Banner & Witcoff, Ltd

(57) ABSTRACT

A semiconductor device has a semiconductor element connected to an input/output terminal and a reference voltage terminal, a first rectifier element connected between the input/output terminal and the reference voltage terminal, which performs rectifier operation to prevent a voltage of the input/output terminal from becoming higher than a voltage of the reference voltage terminal by a predetermined value or more, and a second rectifier element connected between the input/output terminal and the reference voltage terminal, which performs rectifier operation to prevent the voltage of the reference voltage terminal from becoming higher than the voltage of the input/output terminal by a predetermined value or more.

16 Claims, 13 Drawing Sheets

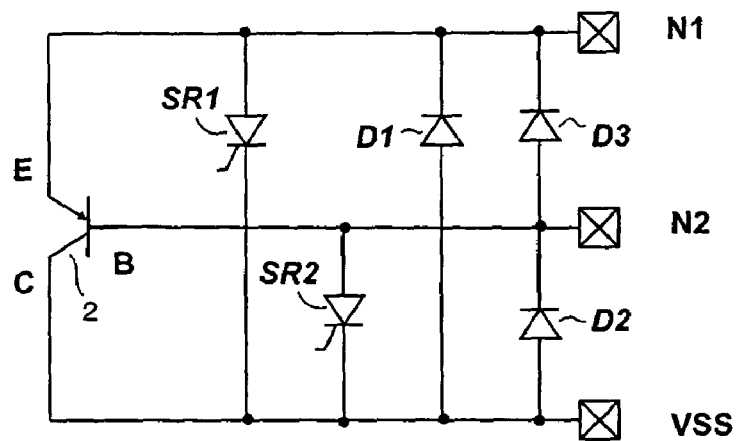
F I G. 3
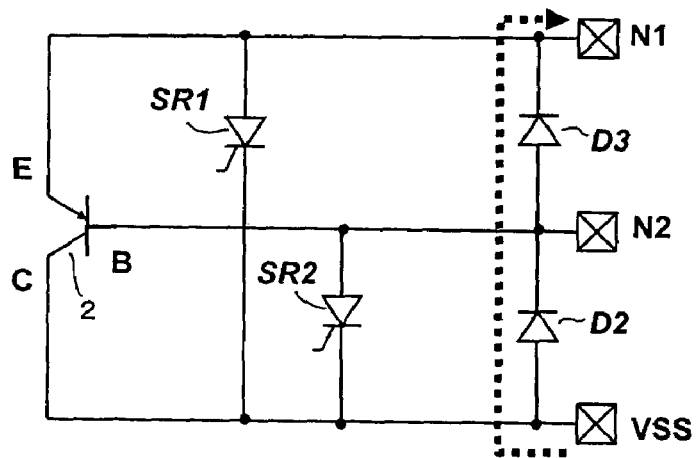
F I G. 4

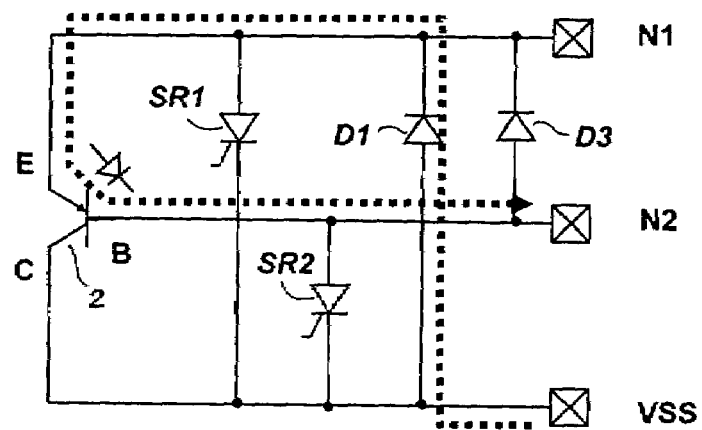
F I G. 5
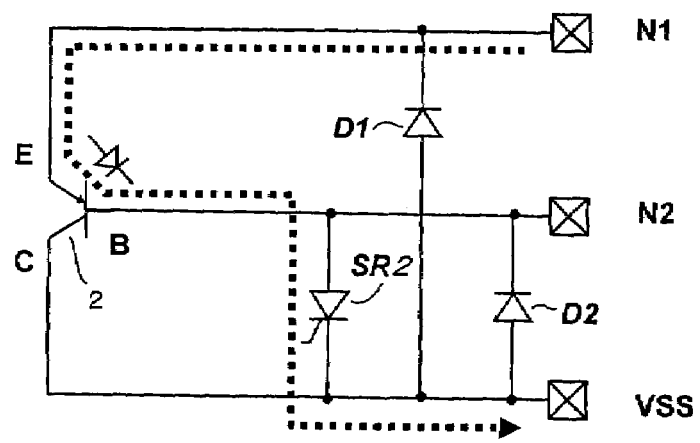
F I G. 6

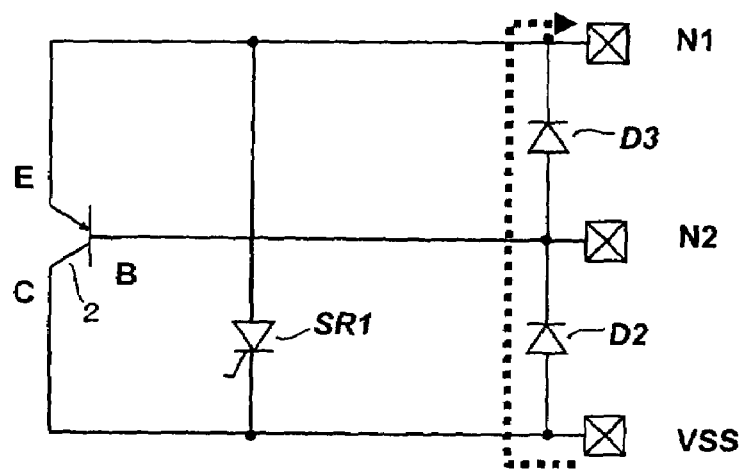
F I G. 11
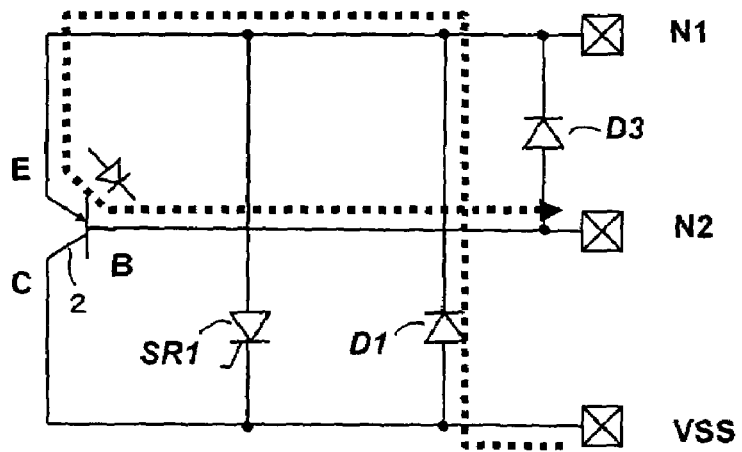
F I G. 12

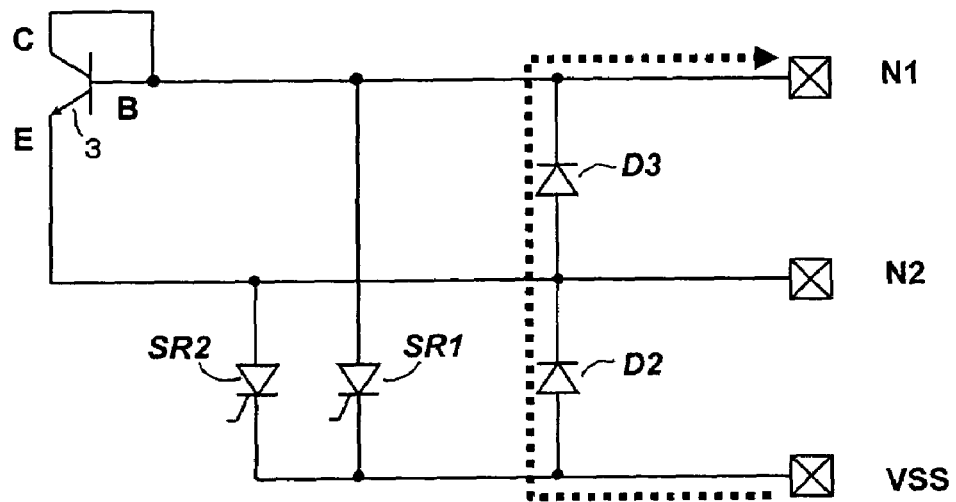
F I G. 15
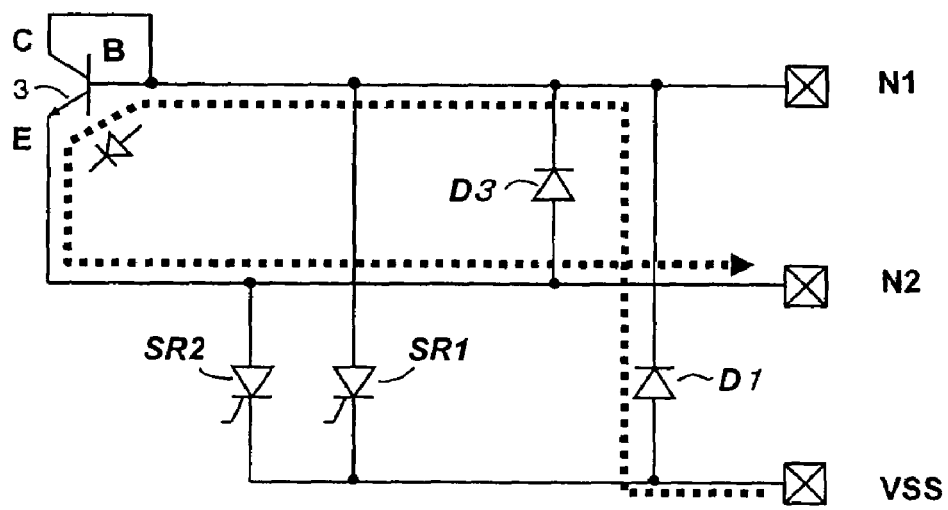
F I G. 16

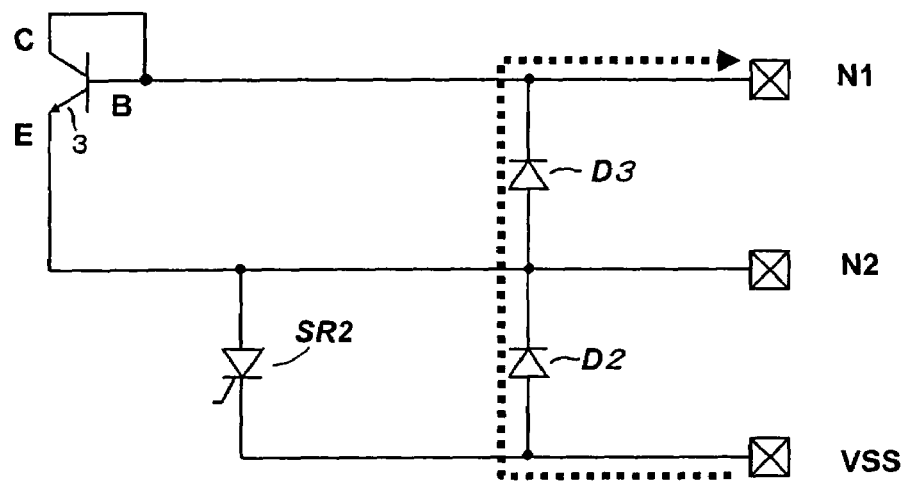
F I G. 19
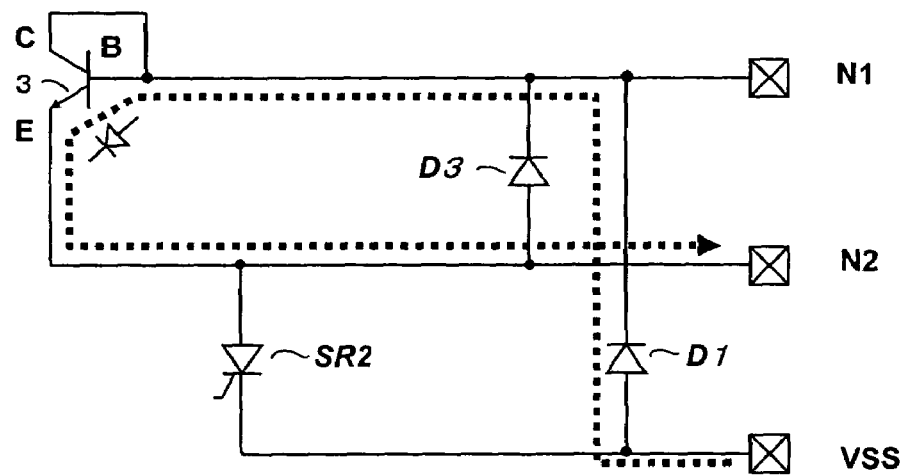
F I G. 20

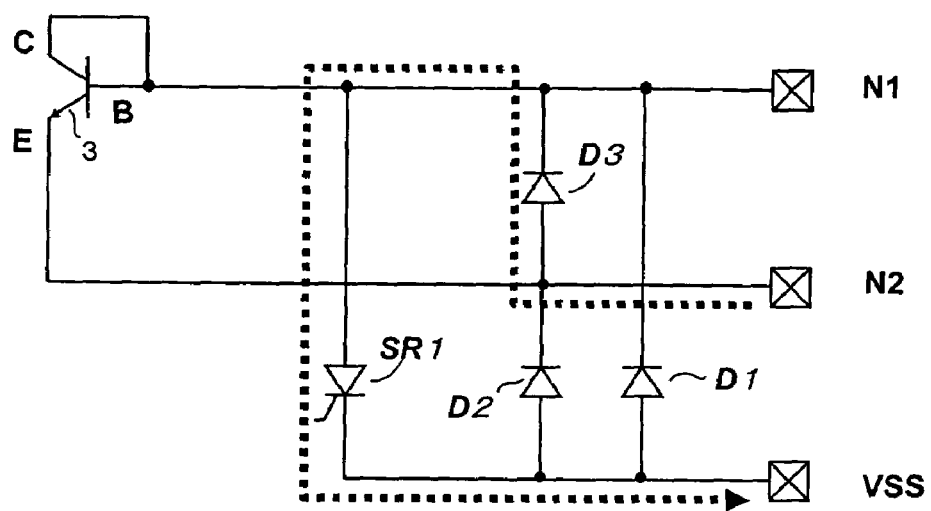
F I G. 21
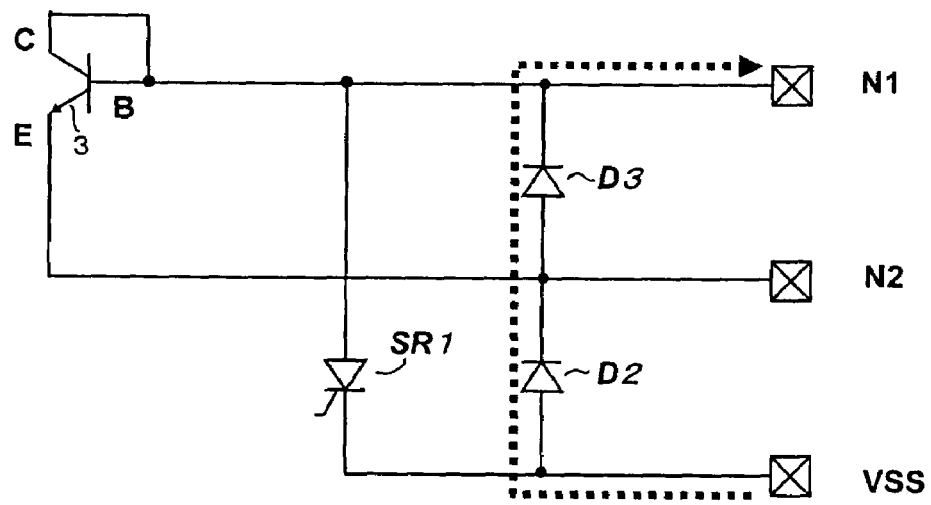
F I G. 22

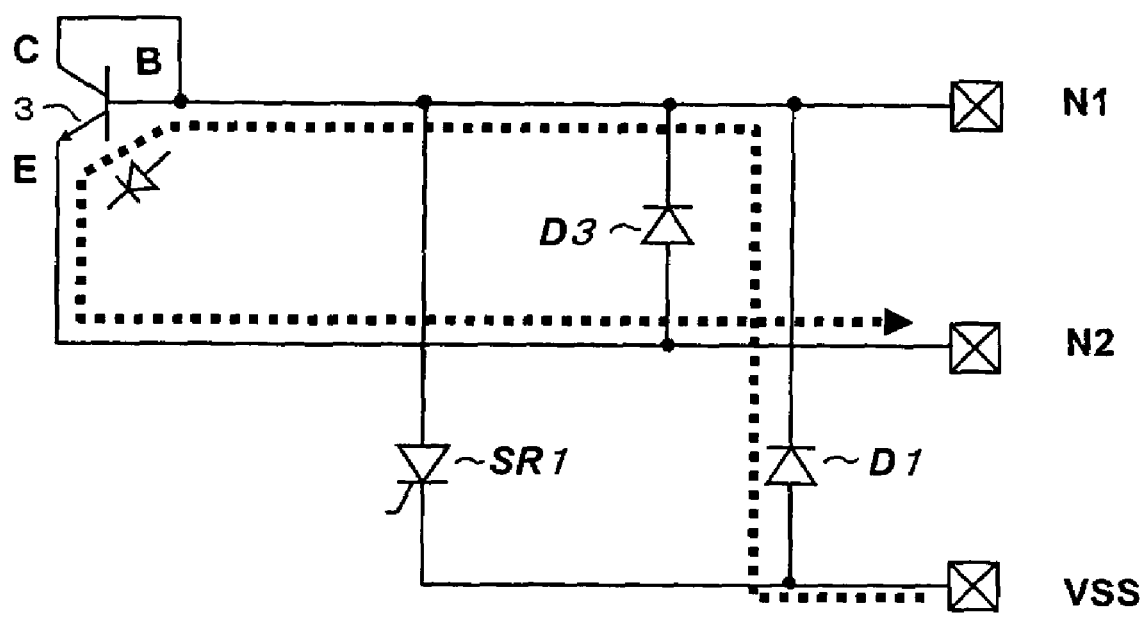
F I G. 23

Us 7,443,703 B2

SEMICONDUCTOR DEVICE

CROSS REFERENCE TO RELATED APPLICATIONS

This application is based upon and claims the benefit of priority from the prior Japanese Patent Application No. 2004-380793, filed on Dec. 28, 2004, the entire contents of which are incorporated herein by reference.

BACKGROUND OF THE INVENTION

1. Field of the Invention

The present invention relates to a semiconductor device with a protection function against ESD (electro-static discharge).

2. Related Art

An ESD protection element is typically connected between each of the input and output terminals and a reference voltage terminal VDD or VSS. The ESD protection element protects a semiconductor element from a breakdown being caused by electro-static discharge when an excessive positive or negative voltage is applied to an input/output terminal (refer to the Japanese Patent Laid-Open Publication No. 2002-124573). However, there are some semiconductor elements such as thermal diode, which use no pair of power source lines. In the case of connecting an ordinary ESD protection element to such an element, an additional power source line which is not related to the operation of the circuit element is necessary, thereby increasing the chip size and the number of pins. In order to avoid increasing the number of pins, it would be possible to connect the ESD protection element to a power source line which is used by another circuit block. In this case, however, noises can be supplied to the other circuit block, or on the contrary, the circuit element may undesirably suffer from noises caused by the other circuit blocks.

SUMMARY OF THE INVENTION

In accordance with one aspect of the invention, there is provided a semiconductor device, comprising:

a semiconductor element connected to an input/output terminal and a reference voltage terminal;

a first rectifier element connected between the input/output terminal and the reference voltage terminal, which performs rectifier operation to prevent a voltage of the input/output terminal from becoming higher than a voltage of the reference voltage terminal by a predetermined value or more; and a second rectifier element connected between the input/output terminal and the reference voltage terminal, which performs rectifier operation to prevent the voltage of the reference voltage terminal from becoming higher than the voltage of the input/output terminal by a predetermined value or more.

Furthermore, a semiconductor device according to one aspect of the invention, a semiconductor element connected to a first input/output terminal, a second input/output terminal and a reference voltage terminal;

a first rectifier circuit which performs rectifier operation to prevent a voltage at the first input/output terminal and a voltage at the second input/output terminal from becoming higher than a voltage of the reference voltage terminal by a predetermined value or more; and a second rectifier circuit which performs rectifier operation to prevent the voltage at the reference voltage terminal from becoming higher than the voltage at the first input/output terminal and the voltage at the second input/output terminal by a predetermined value or more.

BRIEF DESCRIPTION OF THE DRAWINGS

FIG. 3 is a circuit diagram of a semiconductor device according to a third embodiment of the invention.

FIG. 4 is a circuit diagram of a semiconductor device according to a fourth embodiment of the invention.

FIG. 5 is a circuit diagram of a semiconductor device according to a fifth embodiment of the invention.

FIG. 6 is a circuit diagram of a semiconductor device according to a sixth embodiment of the invention.

FIG. 11 is a circuit diagram of a semiconductor device according to an eleventh embodiment of the invention.

FIG. 12 is a circuit diagram of a semiconductor device according to a twelfth embodiment of the invention.

FIG. 15 is a circuit diagram of a semiconductor device according to a fifteenth embodiment of the invention.

FIG. 16 is a circuit diagram of a semiconductor device according to a sixteenth embodiment of the invention.

FIG. 19 is a circuit diagram of a semiconductor device according to a nineteenth embodiment of the invention.

FIG. 20 is a circuit diagram of a semiconductor device according to a twentieth embodiment of the invention.

FIG. 21 is a circuit diagram of a semiconductor device according to a twenty-first embodiment of the invention.

FIG. 22 is a circuit diagram of a semiconductor device according to a twenty-second embodiment of the invention.

FIG. 23 is a circuit diagram of a semiconductor device according to a twenty-third embodiment of the invention.

DETAILED DESCRIPTION OF THE INVENTION

Figure 1:
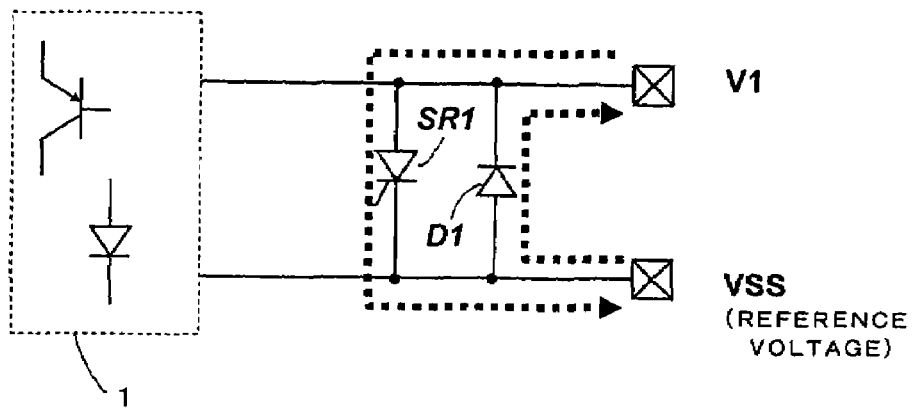
FIG. 1 is a circuit diagram of a semiconductor device according to a first embodiment of the invention.

FIG. 1 is a circuit diagram of a semiconductor device according to a first embodiment of the invention. FIG. 1 shows only a characteristic circuit block extracted from the semiconductor device. The semiconductor device in FIG. 1 includes an input/output terminal V1, a reference voltage terminal VSS, a semiconductor element 1 such as thermal diode, which does not require a pair of power source lines, and a thyristor SR1 and a diode D1 each of which is connected between the input/output terminal V1 and reference voltage terminal VSS. The input/output terminal V1 are used for at least one of a signal input and a signal output.

The thyristor SR1 performs rectifier operation such that the voltage of the input/output terminal V1 does not become higher than that of the reference voltage terminal VSS by a predetermined value or more. More specifically, when the voltage of the input/output terminal V1 becomes higher than that of the reference voltage terminal VSS by at least a predetermined voltage, the thyristor SR1 is turned on. Therefore, the voltage between the input/output terminal V1 and reference voltage terminal VSS is controlled so as not to become larger than a predetermined value. On the contrary, the diode D1 performs rectifier operation such that the voltage at the reference voltage terminal VSS does not become higher than that of the input/output terminal V1 by a predetermined value or more.

For example, it is assumed that the voltage at the input/output terminal V1 becomes higher than that of the reference voltage terminal VSS by a predetermined value or more due to the ESD. In this case, a current flows from the input/output terminal V1 through the thyristor SR1 to the reference voltage terminal VSS. Consequently, the voltage of the path connected to the input/output terminal V1 does not become higher than that of the reference voltage terminal VSS by a predetermined value or more. On the other hand, it is assumed that the voltage at the reference voltage terminal VSS becomes higher than that of the input/output terminal V1 by a predetermined value or more due to the ESD. In this case, a current flows from the reference voltage terminal VSS through the diode D1 to the input/output terminal V1. Consequently, the voltage of the path connected to the reference voltage terminal VSS does not become higher than that of the input/output terminal V1 by a predetermined value or more. Accordingly, even when electro-static discharge occurs, the breakdown of the semiconductor element 1 can be prevented.

In this way, according to the first embodiment, the diode D1 and the thyristor SR1 are connected in directions opposite to each other between the input/output terminal V1 and reference voltage terminal VSS each of terminals connected to the semiconductor element 1. Therefore, even if a dedicated voltage terminal is not provided, it is possible to prevent the semiconductor element 1 from the breakdown caused by the ESD.

Second Embodiment

A second embodiment of the invention is intended to protect a semiconductor element 1 with three terminals from a breakdown caused by electro-static discharge.

Figure 2:
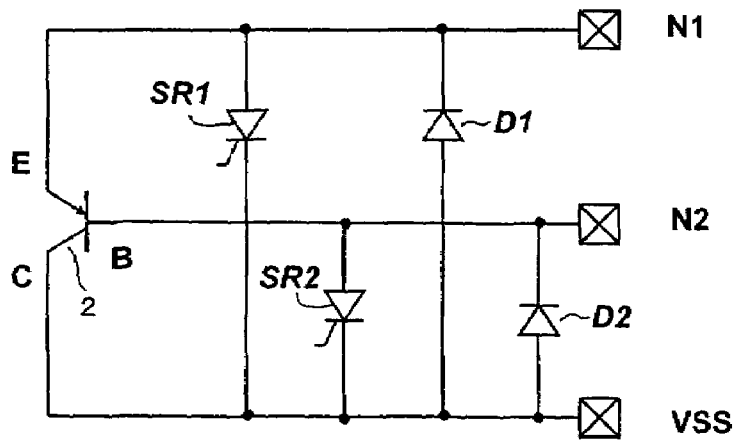
FIG. 2 is a circuit diagram of a semiconductor device according to a second embodiment of the invention.

FIG. 2 is a circuit diagram of a semiconductor device according to a second embodiment of the invention, which includes a PNP bipolar transistor 2 as semiconductor element 1. The transistor 2 functions as thermal diode, for example.

In addition, the semiconductor device shown in FIG. 2 includes a first input/output terminal N1 connected to the emitter of the transistor 2, a second input/output terminal N2 connected to the base of the transistor 2, a reference voltage terminal VSS connected to the collector of the transistor 2, a thyristor SR1 and a diode D1 each connected in parallel between the first input/output terminal N1 and reference voltage terminal VSS, and a thyristor SR2 and a diode D2 each connected in parallel between the second input/output terminal N2 and reference voltage terminal VSS.

The temperature inside the semiconductor device in FIG. 2 can be detected by measuring a potential difference between the first input/output terminal N1 and second input/output terminal N2.

When the voltage at the first input/output terminal N1 becomes higher than that of the reference voltage terminal VSS by a predetermined value or more due to electro-static discharge, the thyristor SR1 is turned on, and a potential difference between the voltage between the first input/output terminal N1 and reference voltage terminal VSS is controlled so as not to become a predetermined value or more.

When the voltage at the second input/output terminal N2 becomes higher than that of the reference voltage terminal VSS by a predetermined value or more due to electro-static discharge, the thyristor SR2 is turned on, and a potential difference between the second input/output terminal N2 and reference voltage terminal VSS is controlled so as not to become larger than a predetermined value.

When the voltage at the reference voltage terminal VSS becomes higher than that of the first input/output terminal N1 by a predetermined value or more due to electro-static discharge, the diode D1 is turned on, and a potential difference between the reference voltage terminal VSS and first input/output terminal N1 is controlled so as not to become larger than a predetermined value.

When the voltage at the reference voltage terminal VSS becomes higher than that of the second input/output terminal N2 by a predetermined value or more due to electro-static discharge, the diode D2 is turned on, and a potential difference between the reference voltage terminal VSS and second input/output terminal N2 does not become larger than a predetermined value.

Conventionally, in order to achieve prevention against electro-static discharge in a circuit using the transistor 2 as shown in FIG. 2, a reference voltage terminal separate from the reference voltage terminal VSS has been provided, and diodes have been connected between the reference voltage terminal and the first input/output terminal N1, and between the reference voltage terminal and the second input/output terminal N2, respectively. According to this embodiment, however, prevention against electro-static discharge can be achieved without providing such a separate reference voltage terminal, as shown in FIG. 2.

In this way, according to the second embodiment, in a circuit having the transistor 2 connected to the first input/output terminal N1, the second input/output terminal N2 and the reference voltage terminal VSS, the thyristor SR1 and the diode D1 are connected in directions opposite to each other between the first input/output terminal N1 and the reference voltage terminal VSS, and the thyristors SR2 and the diode D2 are connected in directions opposite to each other between the second input/output terminal N2 and the reference voltage terminal VSS. Therefore, it is possible to prevent the electro-static discharge without providing any separate reference voltage terminal.

Third Embodiment

A third embodiment is implemented by adding a diode to the circuit shown in FIG. 2.

FIG. 3 is a circuit diagram of a semiconductor device according to a third embodiment of the invention. In FIG. 3, the same reference numeral is attached to the same constituent as that in FIG. 2, and differences will be mainly described below. In addition to the configuration shown in FIG. 2, the semiconductor device of FIG. 3 includes a diode D3 connected between the first input/output terminal N1 and second input/output terminal N2. This diode D3 performs a control such that the voltage at the second input/output terminal N2 does not become higher than that of the first input/output terminal N1 by a predetermined value or more. A large reverse voltage is prevented from being applied between the base and emitter of the transistor 2 by adding such diode D3. Therefore, it is possible to reduce a stress being caused by a reverse voltage.

In this way, according to the third embodiment, in addition to the advantageous effects of the second embodiment, the stress caused by a reverse voltage is prevented from being applied between the base and emitter of the transistor 2, thereby enabling a more stable operation of the transistor 2.

Fourth Embodiment

A fourth embodiment of the invention is implemented by simplifying the circuit of FIG. 3.

FIG. 4 is a circuit diagram of a semiconductor device according to a fourth embodiment of the invention. In FIG. 4, the same reference numeral is attached to the same constituent as that in FIG. 3, and the differences will be mainly described below. The semiconductor device of FIG. 4 does not have the diode D1 which is provided in FIG. 3. The other circuit configuration in FIG. 4 is similar to that of FIG. 3. Even when the diode D1 is omitted, any excessive voltage between the emitter and collector of the transistor 2 is prevented by using the diodes D2 and D3.

In this way, according to the fourth embodiment, the effects similar to those of the circuit in FIG. 3 can be achieved with a simpler circuit configuration than that of FIG. 3.

Fifth Embodiment

A fifth embodiment of the invention is also implemented by simplifying the circuit of FIG. 3.

FIG. 5 is a circuit diagram of a semiconductor device according to a fifth embodiment of the invention. In FIG. 5, the same reference numeral is attached to the same constituent as that in FIG. 3, and the differences will be mainly described below. The semiconductor device of FIG. 5 does not have the diode D2 which is provided in FIG. 3. The other circuit configuration in FIG. 5 is similar to that of FIG. 3. Even when the diode D2 is omitted, any excessive voltage between the reference voltage terminal VSS and the first input/output terminal N1 is prevented by using the diode D1 and the PN junction between the base and emitter of the transistor 2. Accordingly, any excessive voltage is prevented from being applied between the base and collector of the transistor 2.

In this way, according to the fifth embodiment, the effects similar to those of the circuit in FIG. 3 can be achieved with a simpler configuration than that of FIG. 3.

Sixth Embodiment

A sixth embodiment of the invention is implemented by simplifying the circuit of FIG. 2.

FIG. 6 is a circuit diagram of a semiconductor device according to a sixth embodiment of the invention. In FIG. 6, the same reference numeral is attached to the same constituent as that in FIG. 2, and the differences will be mainly described below. Referring to the semiconductor device of FIG. 6, the thyristor SR1 is omitted from the circuit of FIG. 2. However, the other circuit configuration in FIG. 6 is similar to that of FIG. 2.

Even when the thyristor SR1 is omitted, any excessive voltage between the emitter and collector of the transistor 2 is prevented by using the PN junction between the base and emitter of the transistor 2 and the thyristor SR2, as indicated by a dotted line in FIG. 6.

In this way, according to the sixth embodiment, the effects similar to those of FIG. 2 can be achieved with a simpler circuit configuration than that of FIG. 2.

Seventh Embodiment

A seventh embodiment of the invention is implemented by simplifying the circuit of FIG. 3.

Figure 7:
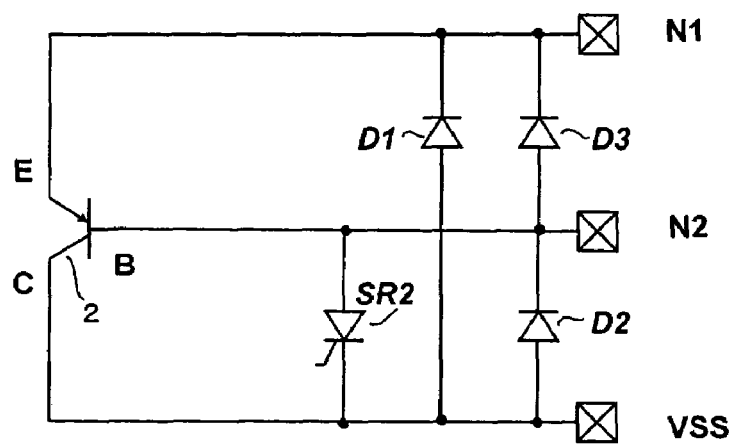
FIG. 7 is a circuit diagram of a semiconductor device according to a seventh embodiment of the invention.

FIG. 7 is a circuit diagram of a semiconductor device according to a seventh embodiment of the invention. In FIG. 7, the same reference numeral is attached to the same constituent as that in FIG. 3, and the differences will be mainly described below. The semiconductor device of FIG. 7 does not have the thyristor SR1 which is provided in FIG. 3. The other circuit configuration in FIG. 7 is similar to that of FIG. 3.

Even when the thyristor is omitted, any excessive voltage between the emitter and collector of the transistor 2 is prevented by using the PN junction between the base and emitter of the transistor 2 and the thyristor SR2, similarly to FIG. 6.

In this way, according to the seventh embodiment, the effects similar to those of FIG. 3 can be achieved with a simpler circuit configuration than that of FIG. 3.

Eighth Embodiment

An eighth embodiment of the invention is implemented by simplifying the circuit of FIG. 4.

Figure 8:
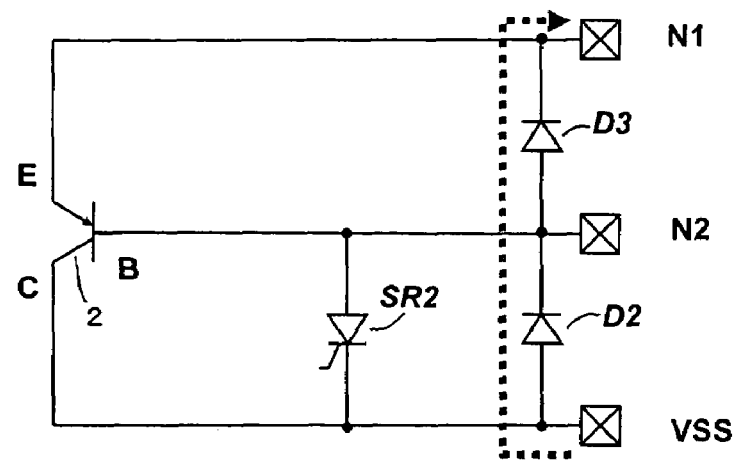
FIG. 8 is a circuit diagram of a semiconductor device according to an eighth embodiment of the invention.

FIG. 8 is a circuit diagram of a semiconductor device according to an eighth embodiment of the invention. The semiconductor device of FIG. 8 does not have the thyristor SR1 which is provided in FIG. 4. However, the other circuit configuration in FIG. 8 is similar to the circuit of FIG. 4.

In this way, according to the eighth embodiment, the effects similar to those of FIG. 4 can be achieved with a simpler circuit configuration than that of FIG. 4.

Ninth Embodiment

A ninth embodiment of the invention is implemented by simplifying the circuit of FIG. 5.

Figure 9:
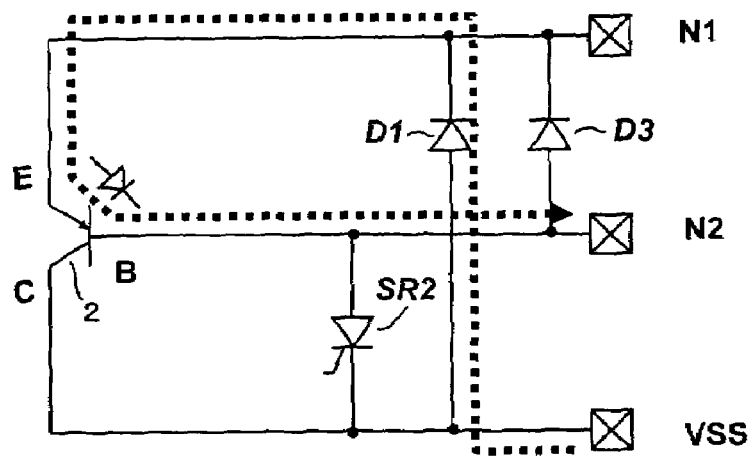
FIG. 9 is a circuit diagram of a semiconductor device according to a ninth embodiment of the invention.

FIG. 9 is a circuit diagram of a semiconductor device according to a ninth embodiment of the invention. The semiconductor device of FIG. 9 does not have the thyristor SR1 which is provided in FIG. 5. However, the other circuit configuration in FIG. 9 is similar to that of FIG. 5.

In this way, according to the ninth embodiment, the effects similar to those of FIG. 5 can be achieved with a simpler circuit configuration than that of FIG. 5.

Tenth Embodiment

A tenth embodiment of the invention is implemented by simplifying the circuit of FIG. 3.

Figure 10:
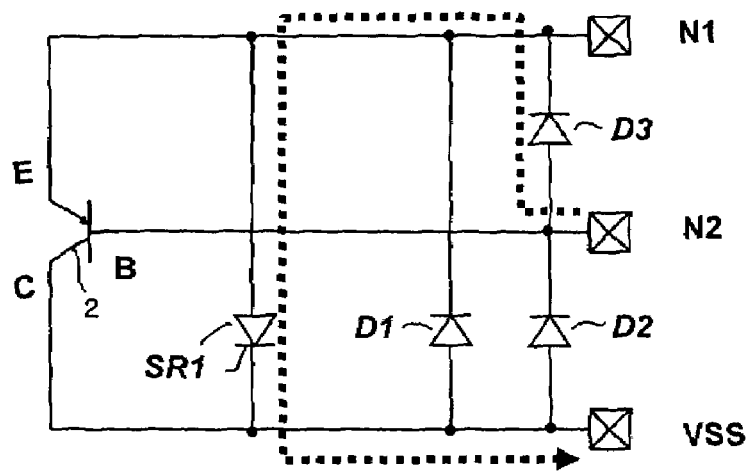
FIG. 10 is a circuit diagram of a semiconductor device according to a tenth embodiment of the invention.

FIG. 10 is a circuit diagram of a semiconductor device according to a tenth embodiment of the invention. In FIG. 10, the same reference numeral is attached to the same constituent as that in FIG. 3, and the differences will be mainly described below. The semiconductor device of FIG. 10 does not have the thyristor SR2 which is provided in FIG. 3. However, the other circuit configuration is similar to that of FIG. 3.

Even when the thyristor SR2 is omitted, any excessive voltage between the base and collector of the transistor 2 is prevented by using the diode D3 and the thyristor SR1, as indicated by a dotted line in FIG. 10.

In this way, according to the tenth embodiment, the effects similar to those of FIG. 3 can be achieved with a simpler circuit configuration than that of FIG. 3.

Eleventh Embodiment

An eleventh embodiment of the invention is implemented by simplifying the circuit of FIG. 4.

FIG. 11 is a circuit diagram of a semiconductor device according to an eleventh embodiment of the invention. The semiconductor device of FIG. 11 does not have the thyristor SR2 which is provided in FIG. 4. However, the other circuit configuration in FIG. 11 is similar to that of FIG. 4.

In this way, according to the eleventh embodiment, the effects similar to those of FIG. 4 can be achieved with a simpler circuit configuration than that of FIG. 4.

Twelfth Embodiment

A twelfth embodiment of the invention is implemented by simplifying the circuit of FIG. 5.

FIG. 12 is a circuit diagram of a semiconductor device according to a twelfth embodiment of the invention. The semiconductor device of FIG. 12 does not have the thyristor SR2 which is provided in FIG. 5. However, the other circuit configuration is similar to that of FIG. 5.

In this way, according to the twelfth embodiment, the effects similar to those of FIG. 5 can be achieved with a simpler circuit configuration than that of FIG. 5.

Thirteenth Embodiment

In thirteenth to twenty-third embodiments to be described below, NPN bipolar transistor 3 is used as semiconductor element 1.

Figure 13:
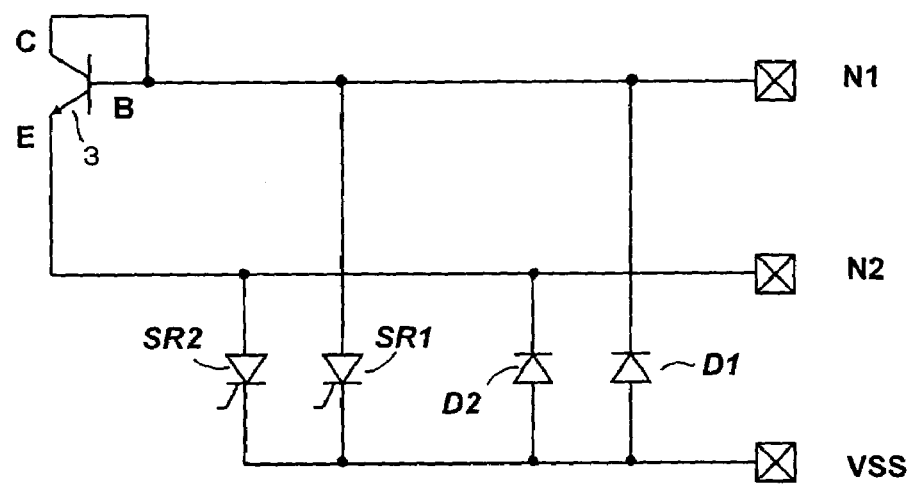
FIG. 13 is a circuit diagram of a semiconductor device according to a thirteenth embodiment of the invention.

FIG. 13 is a circuit diagram of a semiconductor device according to a thirteenth embodiment of the invention. The semiconductor device of FIG. 13 includes a NPN bipolar transistor 3, a first input/output terminal N1 connected to the base of the transistor 3, a second input/output terminal N2 connected to the emitter of the transistor 3, a thyristor SR1 connected between the first input/output terminal N1 and a reference voltage terminal VSS, a thyristor SR2 connected between the second input/output terminal N2 and reference voltage terminal VSS, a diode D1 connected between the reference voltage terminal VSS and first input/output terminal N1, and a diode D2 connected between the reference voltage terminal VSS and second input/output terminal N2.

An excessive voltage between the first input/output terminal N1 and reference voltage terminal VSS is prevented by the thyristor SR1. An excessive voltage between the input/output terminal N2 and reference voltage terminal VSS is prevented by the thyristor SR2. Excessive voltages in the direction opposite to the above described voltages are prevented by the diodes D1 and D2, respectively.

In this way, according to the thirteenth embodiment, any excessive potential difference between the first input/output terminal N1 and reference voltage terminal VSS each connected to the transistor 3, and any excessive potential difference between the second input/output terminal N2 and reference voltage terminal VSS are each prevented by using the thyristors SR1 and SR2 and the diodes D1 and D2 connected between the terminals. Accordingly, a separate reference voltage terminal is unnecessary, thus enabling reduction of the chip size and the number of pins.

Fourteenth Embodiment

A fourteenth embodiment is implemented by adding a diode to the circuit shown in FIG. 13.

Figure 14:
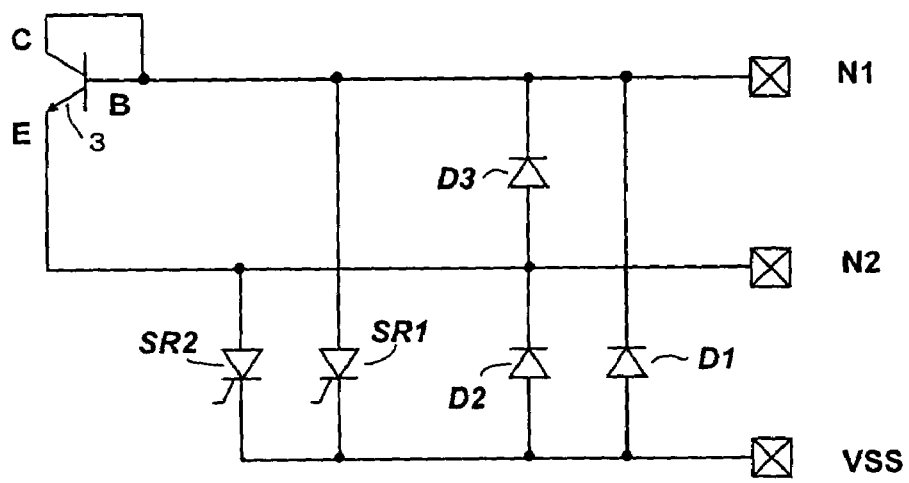
FIG. 14 is a circuit diagram of a semiconductor device according to a fourteenth embodiment of the invention.

FIG. 14 is a circuit diagram of a semiconductor device according to a fourteenth embodiment of the invention. In FIG. 14, the same reference numeral is attached to the same constituent as that in FIG. 13, and the differences will be mainly described below. In addition to the circuit of FIG. 13, the semiconductor device of FIG. 14 includes a diode D3 connected between the first input/output terminal N1 and second input/output terminal N2. A large reverse voltage is prevented from being applied between the base and emitter of the transistor 3 by adding such diode D3, thus enabling reduction of the stress caused by the reverse voltage.

In this way, according to the fourteenth embodiment, in addition to the advantageous effects of the thirteenth embodiment, the stress caused by a reverse voltage is prevented from being applied between the base and emitter of the transistor 3, thereby enabling a more stable operation of the transistor 3.

Fifteenth Embodiment

A fifteenth embodiment of the invention is implemented by simplifying the circuit of FIG. 14.

FIG. 15 is a circuit diagram of a semiconductor device according to a fifteenth embodiment of the invention. In FIG. 15, the same reference numeral is attached to the same constituent as that in FIG. 14, and the differences will be mainly described below. The semiconductor device of FIG. 15 does not have the diode D1 which is provided in FIG. 14. Even when the diode D1 is omitted, any excessive voltage between the first input/output terminal N1 and reference voltage terminal VSS is prevented by using the diodes D2 and D3.

In this way, according to the fifteenth embodiment, the effects similar to those of FIG. 14 can be achieved with a simpler configuration than that of FIG. 14.

Sixteenth Embodiment

A sixteenth embodiment of the invention is also implemented by simplifying the circuit of FIG. 14.

FIG. 16 is a circuit diagram of a semiconductor device according to a sixteenth embodiment of the invention. In FIG. 16, the same reference numeral is attached to the same constituent as that in FIG. 14, and the differences will be mainly described below. The semiconductor device of FIG. 16 does not have the diode D2 which is provided in FIG. 14. Even when the diode D2 is omitted, any excessive reverse voltage between the second input/output terminal N2 and reference voltage terminal VSS is prevented by using the diode D1 and the PN junction between the base and emitter of the transistor 3.

In this way, according to the sixteenth embodiment, the effects similar to those of the circuit of FIG. 14 can be achieved with a simpler configuration than that of FIG. 14.

Seventeenth Embodiment

A seventeenth embodiment of the invention is implemented by simplifying the circuit of FIG. 14.

Figure 17:
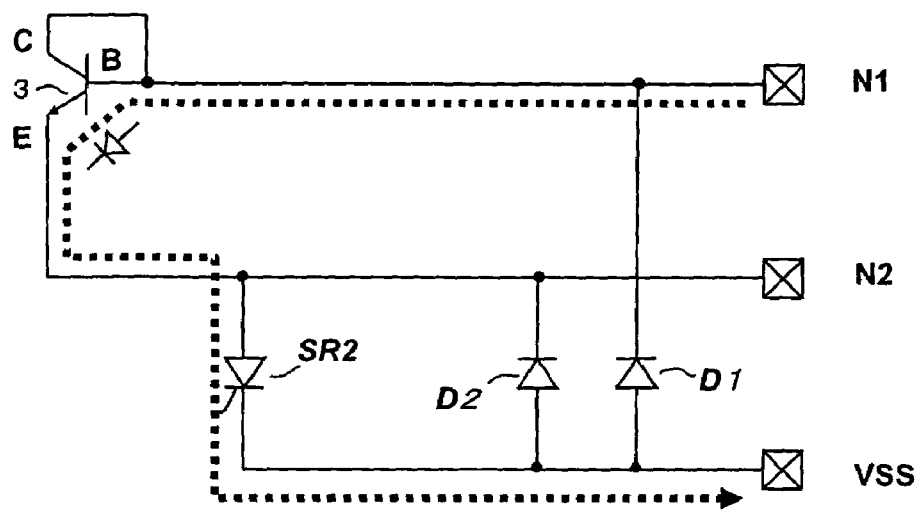
FIG. 17 is a circuit diagram of a semiconductor device according to a seventeenth embodiment of the invention.

FIG. 17 is a circuit diagram of a semiconductor device according to a seventeenth embodiment of the invention. In FIG. 17, the same reference numeral is attached to the same constituent as that in FIG. 14, and the differences will be mainly described below. The semiconductor device of FIG. 17 does not have the thyristor SR1 which is provided in FIG. 14.

Even when the thyristor SR1 is omitted, any excessive voltage between the first input/output terminal N1 and reference voltage terminal VSS is prevented by using the PN junction between the base and emitter of the transistor 3 and the thyristor SR2, as indicated by a dotted line in FIG. 17.

In this way, according to the seventeenth embodiment, the effects similar to those of FIG. 14 can be achieved with a simpler circuit configuration than that of FIG. 14.

Eighteenth Embodiment

An eighteenth embodiment of the invention is implemented by simplifying the circuit of FIG. 14.

Figure 18:
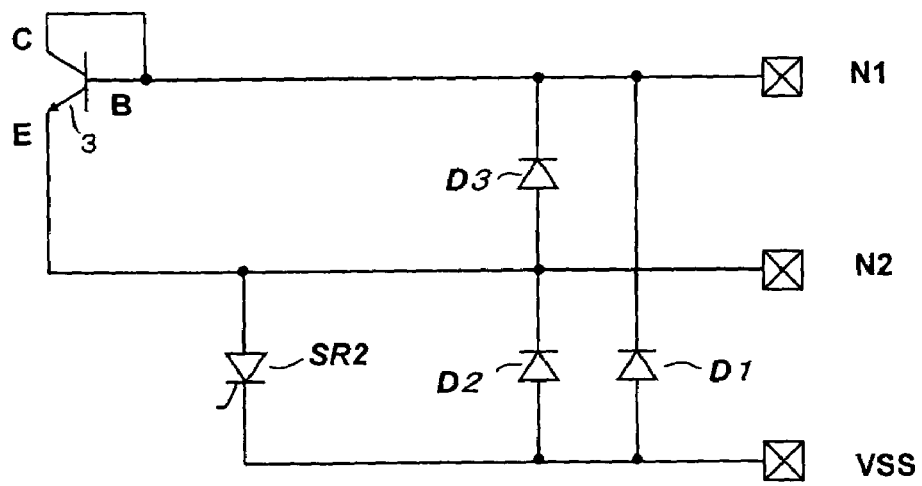
FIG. 18 is a circuit diagram of a semiconductor device according to an eighteenth embodiment of the invention.

FIG. 18 is a circuit diagram of a semiconductor device according to an eighteenth embodiment of the invention. In FIG. 18, the same reference numeral is attached to the same constituent as that in FIG. 14, and the differences will be mainly described below. The semiconductor device of FIG. 18 does not have the thyristor SR1 which is not provided in FIG. 14. However, the other circuit configuration in FIG. 18 is similar to that of FIG. 14.

Even when the thyristor SR1 is omitted, any excessive voltage between the first input/output terminal N1 and reference voltage terminal VSS is prevented, similarly to FIG. 17, by using the PN junction between the base and emitter of the transistor 3 and the thyristor SR2.

In this way, according to the eighteenth embodiment, the effects similar to those of the circuit of FIG. 14 can be achieved with a simpler circuit configuration than that of FIG. 14.

Nineteenth Embodiment

A nineteenth embodiment of the invention is implemented by simplifying the circuit of FIG. 18.

FIG. 19 is a circuit diagram of a semiconductor device according to a nineteenth embodiment of the invention. The semiconductor device of FIG. 19 does not have the diode D1 which is not provided in FIG. 18. However, the other circuit configuration in FIG. 19 is similar to that of FIG. 18.

In this way, according to the nineteenth embodiment, the effects similar to those of FIG. 18 can be achieved with a simpler configuration than that of FIG. 18.

Twentieth Embodiment

A twentieth embodiment of the invention is implemented by simplifying the circuit of FIG. 16.

FIG. 20 is a circuit diagram of a semiconductor device according to a twentieth embodiment of the invention. The semiconductor device of FIG. 20 does not have the thyristor SR1 which is provided in FIG. 16. However, the other circuit configuration in FIG. 20 is similar to the circuit of FIG. 16.

In this way, according to the twentieth embodiment, the effects similar to those of FIG. 16 can be achieved with a simpler circuit configuration than that of FIG. 16.

Twenty-first Embodiment

A twenty-first embodiment of the invention is implemented by simplifying the circuit of FIG. 14.

FIG. 21 is a circuit diagram of a semiconductor device according to a twenty-first embodiment of the invention. In FIG. 21, the same reference numeral is attached to the same constituent as that in FIG. 14, and the differences will be mainly described below. The semiconductor device of FIG. 21 does not have the thyristor SR2 which is provided in FIG. 14. However, the other circuit configuration in FIG. 21 is similar to that of FIG. 14.

Even when the thyristor SR2 is omitted, any excessive voltage between the second input/output terminal N2 and reference voltage terminal VSS is prevented by the diode D3 and thyristor SR1.

In this way, according to the twenty-first embodiment, the effects similar to those of FIG. 14 can be achieved with a simpler configuration than that of FIG. 14.

Twenty-second Embodiment

A twenty-second embodiment of the invention is implemented by simplifying the circuit of FIG. 15.

FIG. 22 is a circuit diagram of a semiconductor device according to a twenty-second embodiment of the invention. The semiconductor device of FIG. 22 does not have the thyristor SR2 which is provided in FIG. 15. However, the other circuit configuration in FIG. 22 is similar to the circuit of FIG. 15.

In this way, according to the twenty-second embodiment, the effects similar to those of FIG. 15 can be achieved with a simpler circuit configuration than that of FIG. 15.

Twenty-third Embodiment

A twenty-third embodiment of the invention is implemented by simplifying the circuit of FIG. 16.

FIG. 23 is a circuit diagram of a semiconductor device according to a twenty-third embodiment of the invention. The semiconductor device of FIG. 23 does not have the thyristor SR2 which is provided in FIG. 16. However, the other circuit configuration is similar to that of FIG. 16.

In this way, according to the twenty-third embodiment, the effects similar to those of FIG. 16 can be achieved with a simpler circuit configuration than that of FIG. 16.

Other Embodiment

The semiconductor device (hereinafter referred to as a temperature detection circuit, for convenience) explained in each of the above described embodiments is applicable to a processor or a graphic processor (hereinafter, simply referred to as a processor), for example. In current processors, the operating frequency is very high, and the number of transistors 3 incorporated in the processor is also enormously large. Consequently, a large amount of heat is generated within the processor. If any measure is not taken against the heat generated within the processor, the thermorunaway or thermal destruction of the processor and its peripheral circuitry may occur. Accordingly, it is desirable that the operating frequency or operating mode of the processor be controlled according to the internal temperature of the processor by monitoring the internal temperature at all times.

With the above described temperature detection circuit, the temperature within the processor can be detected accurately and quickly, thus enabling a fine control of the operating frequency or operating mode of the processor.

Figure 24:
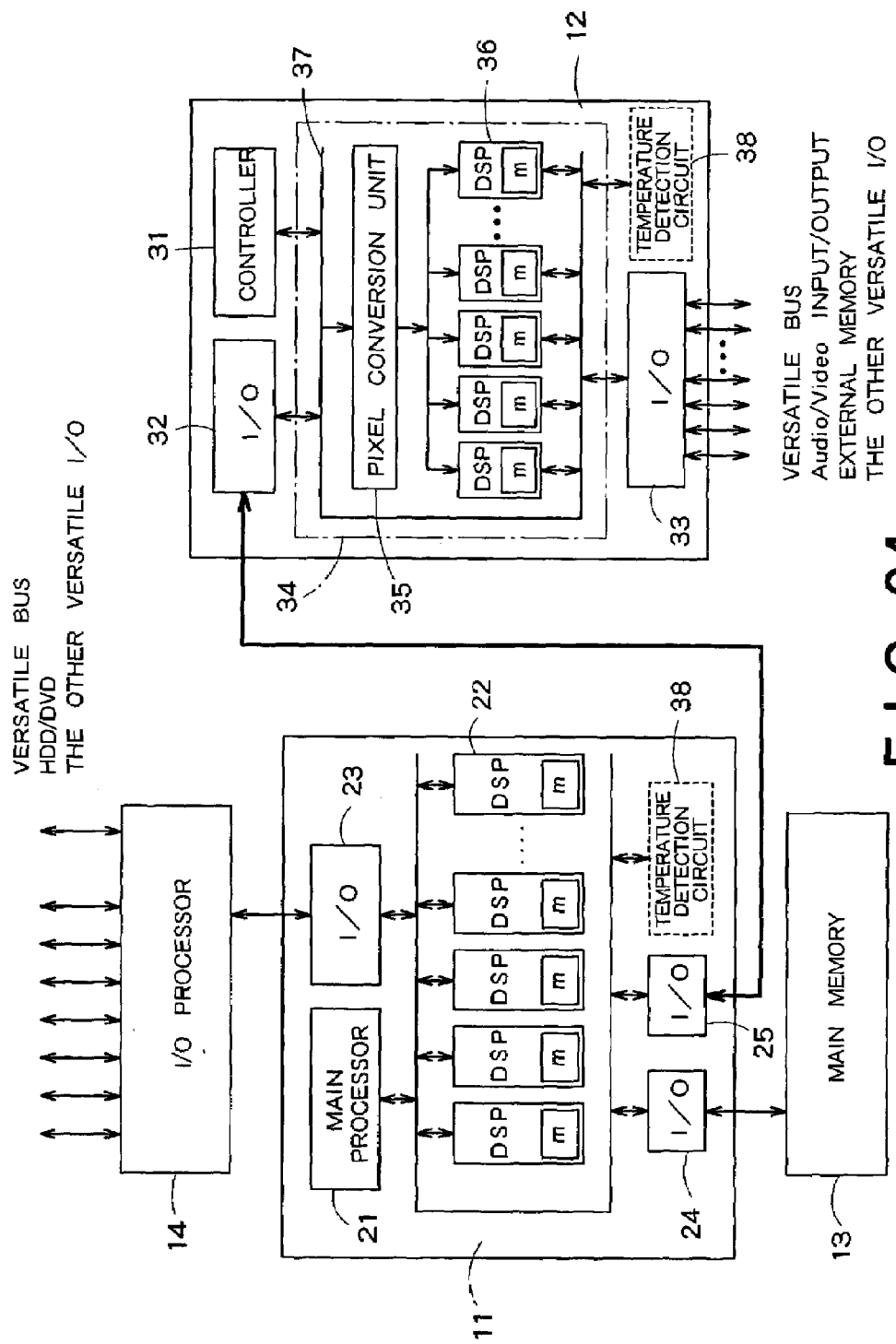
FIG. 24 is a block diagram showing an exemplary internal configuration of a processor system with a built-in temperature detection circuit according to each of the above described embodiments.

FIG. 24 is a block diagram showing an exemplary internal configuration of a processor system with a built-in temperature detection circuit according to each of the above described embodiments. The processor system shown in FIG. 24 includes a host processor 11, a graphic processor 12, a main memory 13, and an I/O processor 14.

The host processor 11 includes a main processor 21, a plurality of signal processing units (DSP: Digital Signal Processor) 22, and I/O units 23, 24, and 25 performing the input/output operation from/to the outside. The I/O unit 24 performs the input/output operation from/to the main memory 13, the I/O unit 25 performs the input/output operation from/to the graphic processor 12, and the I/O unit 23 performs the input/output operation from/to the I/O processor 14.

The graphic processor 12 includes a controller 31, an I/O unit 32 exchanging data with the host processor 11, an I/O unit 33 which performs communications with various versatile bus interfaces such as PCI, and performs the input/output operation of video and audio data, etc., and an image processing unit 34.

The I/O processor 14 performs a control for connecting versatile bus interfaces, peripheral devices including HDD and DVD drives, and networks.

The image processing unit 34 performs the image processing in parallel with the processing in the host processor 11. Accordingly, the host processor 11 itself does not need to perform the three-dimensional image processing, thus reducing the processing load of the host processor 11, and at the same time enabling a rapid three-dimensional image processing.

The image processing unit 34 includes a graphic processing unit 35 and a plurality of processing units 36. The pixel conversion unit 35 and processing units 36 are connected to a local area network 37.

The pixel conversion unit 35 calculates the coordinate and parameters of each pixel for each stamp of adjacent stamps consisting of 2×2 pixels, and supplies the calculated result to the corresponding processing unit 36. The plurality of processing units 36 can perform processing in parallel with each other. Specifically, each processing unit 36 performs the image processing of a different stamp.

The plurality of processing units 36 shown in FIG. 24 can perform image processing in parallel with each other, thus enabling a rapid image processing.

In the processor system of FIG. 24, a circuit 38 (hereinafter referred to as a temperature detection circuit) explained in each of the above described embodiments is provided in at least one of the host processor 11 and graphic processor 12. A plurality of temperature detection circuits 38 may be provided in one chip, if necessary. Especially, when the host processor and graphic processor are composed of separate chips with large heat generation, it is desirable that the temperature detection circuit 38 is provided for each processor.

When the temperature detection circuit 38 having the circuit configuration explained in each of the above described embodiments is built into a processor system, temperature measurement can be performed even when the microprocessor is not operated, which is very convenient. This is because the above described diode for prevention against electrostatic discharge requires only VSS, and it is not necessary to supply a power source voltage terminal VDD. Accordingly, the temperature detection circuit 38, constructed without any power source voltage VDD, is free from adverse influences introduced by heat, noise, etc. generated by the power source voltage VDD, thereby enabling an accurate temperature measurement.

The thyristors SR1 and SR2 shown in FIG. 1 and the other drawings may be replaced with diodes. The diodes D1 and D2 shown in FIGS. 1, 2 and the other drawings may be replaced with the transistors functioning as the diodes.

What is claimed is:

1. A semiconductor device, comprising:
    a semiconductor element connected to an input/output terminal and a reference voltage terminal;
    a first rectifier element connected between the input/output terminal and the reference voltage terminal, which performs rectifier operation to prevent a voltage of the input/output terminal from becoming higher than a voltage of the reference voltage terminal by a predetermined value or more; and
    a second rectifier element connected between the input/output terminal and the reference voltage terminal, which performs rectifier operation to prevent the voltage of the reference voltage terminal from becoming higher than the voltage of the input/output terminal by a predetermined value or more,
    wherein the semiconductor element includes a thermal diode, and
    wherein a temperature is detected by a potential difference of the input/output terminal and the reference voltage terminal.

2. A semiconductor device according to claim 1,
    wherein the first rectifier element has a thyristor or a diode; and
    the second rectifier element has a diode or a transistor functioning as a diode.

3. A semiconductor device, comprising:
    a semiconductor element connected to a first input/output terminal, a second input/output terminal and a reference voltage terminal;
    a first rectifier circuit which performs rectifier operation to prevent a voltage at the first input/output terminal and a voltage at the second input/output terminal from becoming higher than a voltage of the reference voltage terminal by a predetermined value or more; and
    a second rectifier circuit which performs rectifier operation to prevent the voltage at the reference voltage terminal from becoming higher than the voltage at the first input/output terminal and the voltage at the second input/output terminal by a predetermined value or more,
    wherein the semiconductor element includes a thermal diode, and
    wherein a temperature is detected by a potential difference between the first input/output terminal and the second input/output terminal.

4. A semiconductor device according to claim 3,
    wherein the first rectifier circuit has at least one of a first rectifier element which is connected between at least one of the first input/output terminal and the second input/output terminal and the reference voltage terminal, and can flow an electric current in a direction from at least one of the first input/output terminal and the second input/output terminal to the reference voltage terminal.

5. A semiconductor device according to claim 4, wherein the first rectifier element has a thyristor or a diode.

6. A semiconductor device according to claim 3,
    wherein the second rectifier circuit has at least one of a first rectifier element which is connected between the reference voltage terminal and at least one of the first input/output terminal and the second input/output terminal, and can flow an electric current in only a direction from the reference voltage terminal to at least one of the input/output terminal and the second input/output terminal.

7. A semiconductor device according to claim 6, wherein the second rectifier element has a diode or a transistor functioning as a diode.

8. A semiconductor device according to claim 3,
wherein the second rectifier circuit has first and second rectifier elements which are connected in series between the first input/output terminal and the second input/output terminal, and can flow an electric current in only a direction from one of the first input/output terminal and the second input/output terminal to the other.

9. A semiconductor device according to claim 3,
wherein the semiconductor element has a PN junction which performs rectifier operation between the first input/output terminal and the second input/output terminal.

10. A semiconductor device according to claim 9,
wherein the first rectifier circuit performs rectifier operation by using the PN junction.

11. A semiconductor device according to claim 9,
wherein the second rectifier circuit performs rectifier operation by using the PN junction.

12. A semiconductor device according to claim 3,
wherein the semiconductor element is a PNP transistor;
the first input/output terminal is connected to an emitter of the PNP transistor;
the second input/output terminal is connected to a base of the PNP transistor; and
the reference voltage terminal is connected to a collector of the PNP transistor.

13. A semiconductor device according to claim 3,
wherein the semiconductor element has an NPN transistor;
the first input/output terminal is connected to a base of the NPN transistor; and
the second input/output terminal is connected to an emitter of the NPN transistor.

14. A semiconductor device according to claim 13,
wherein a base and a collector of the NPN transistor is short-circuited to each other.

15. A semiconductor device according to claim 1, further comprising:
an image processing unit which performs image processing; and
a processor which controls the image processing unit,
wherein at least one of the image processing unit and the processor has the semiconductor element the first rectifier element and the second rectifier element.

16. A semiconductor device according to claim 3, further comprising:
an image processing unit which performs image processing; and
a processor which controls the image processing unit,
wherein at least one of the image processing unit and the processor has the semiconductor element the first rectifier element and the second rectifier element.

* * * * *